United States Patent [19]

Winebarger

[11] 4,217,553

[45] Aug. 12, 1980

[54] DYNAMIC SLICING COMPENSATION FOR ATTENUATED SIGNALS IN PULSE WIDTH MODULATION

[75] Inventor: Joseph P. Winebarger, Knightdale, N.C.

[73] Assignee: Telex Computer Products, Inc., Raleigh, N.C.

[21] Appl. No.: 912,471

[22] Filed: Jun. 5, 1978

[51] Int. Cl.² .................. H03K 5/08; H03K 5/153
[52] U.S. Cl. .................. 328/164; 307/268; 307/358; 328/117
[58] Field of Search .............. 307/356, 358, 261, 268, 307/351; 328/162–165, 151, 115.7; 340/146.3 AC, 146.3 AE, 146.3 AG

[56] References Cited

U.S. PATENT DOCUMENTS

| | | | |
|---|---|---|---|
| 3,348,065 | 10/1967 | Schmidt | 307/358 X |
| 3,502,993 | 3/1970 | Schürzinger et al. | 307/358 X |
| 3,566,281 | 2/1971 | Baumann | 307/358 X |
| 3,991,379 | 11/1976 | Chadwick et al. | 307/358 X |
| 4,121,121 | 10/1978 | Gabeler | 307/358 |

*Primary Examiner*—John Zazworsky
*Attorney, Agent, or Firm*—Head & Johnson

[57] ABSTRACT

A dynamic slicing compensator for attenuated pulse width modulated signals, for use at the receiving end of a transmission line which comprises a voltage comparator the negative input of which is connected to the end of the transmission line. A negative peak riding circuit is provided with sufficient time delay to substantially follow the negative peaks of the pulse width modulation signals. A reference or slicing voltage is provided, preferably approximately midway between the negative peaks and the baseline. This reference voltage is connected to the positive input of the comparator. As the attenuation and distortion increases, the negative peaks become smaller and the reference voltage similarly becomes smaller, maintaining a substantially constant ratio to the value of the negative peaks.

2 Claims, 4 Drawing Figures

DYNAMIC SLICING COMPENSATION FOR ATTENUATED SIGNALS IN PULSE WIDTH MODULATION

BACKGROUND OF THE INVENTION

1. Field of the Invention

This invention lies in the field of electrical signal transmission. More particularly, it concerns the use of pulse width modulation signals, and the accurate detection of such signals after passing through noisy transmission lines, in which the signal becomes attenuated and distorted.

Still more particularly, this invention is concerned with the design of a dynamic reference or slicing means, which is designed to separate the detected signal from noise, and to maintain an optimum ratio between the reference or slicing signal and the peak amplitude of the signal.

2. Description of the Prior Art

It is well known that a pulse width modulated signal comprises square pulses of selected widths to denote digital ones and zeros. However, when a train of ones and zeros is passed through a transmission means, the square signals distort into rounded signals. Also the peak magnitude of the signals decrease. If the signal is embedded in noise, as is usually the case, a detector or comparator must be set with a reference voltage which excludes as much as possible the noise. In conventional systems the reference voltage is set at approximately one-half the peak value of the signal, which is greater than the peak value of the noise. Whenever the signal exceeds the value of the reference signal, then the comparator indicates signal, and responds to the signal, and transmits it out through its output.

Unfortunately, if a fixed reference voltage is used in the detecting system, it is optimum only for a single length of transmission line or cable. If the reference is set for optimum use with long cable, the system becomes more susceptible to small noise perturbations. If the reference is set at the optimum for short lengths, the system will fail to work if the length of cable is increased, and the signal is sufficiently attenuated.

SUMMARY OF THE INVENTION

It is a primary object of this invention to provide a dynamic reference or slicing voltage, in a detection system for pulse width modulated signals.

It is a further object of this invention to provide a means for varying the reference of slicing voltage, as a function of the attenuated amplitude of the signal passing through a transmission means.

These and other objects are realized and the limitations of the prior art are overcome in this invention by providing a circuit on the receiving end of a transmission means, which has a selected time constant and measures substantially the peak voltage of the signal. This voltage is used to provide a voltage of substantially half the peak voltage of the signal, which serves as a dynamic slicing or reference signal. As the signal attenuates with greater length of transmission means, the slicing or reference voltage correspondingly decreases, maintaining a fixed relation to the average peak value of the signal.

BRIEF DESCRIPTION OF THE DRAWINGS

These and other objects and advantages of this invention and a better understanding of the principles and details of the invention will be evident from the following description taken in conjunction with the appended drawings, in which.

DESCRIPTION OF THE PREFERRED EMBODIMENT

Figure 1:
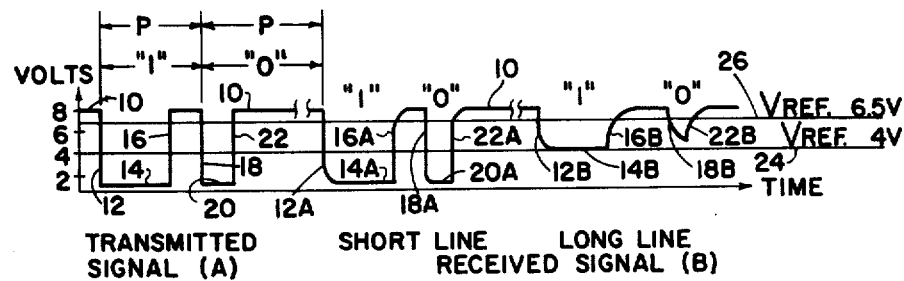
FIGS. 1 and 2 represent the prior art, showing the typical transmitted and received pulse width modulated signals, and also the typical type of detector for detecting the received signals.
Figure 2:
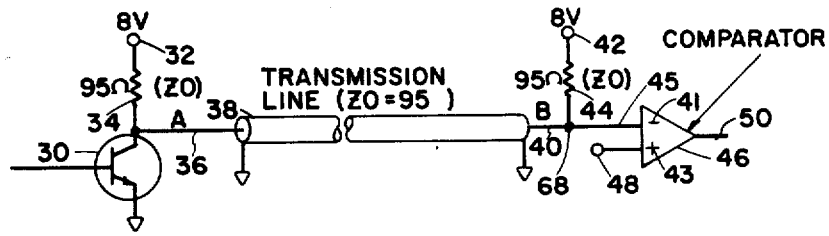

Referring now to the drawings and in particular to FIGS. 1 and 2, there is shown a typical pulse width modulated signal having a base 10, and having negative peaks of the order of magnitude of about eight volts. A binary "one" is generated by a vertical line 12 going to a negative peak 14, of constant value, for a period of time, which is a major fraction of the period P of each signal. Each binary signal occupies a time period denoted by P, and each signal comprises a negative peak and a return to the base 10. In a binary "one", the negative peak occupies more than half of the period P, while in the binary "zero" the negative peak 20 occupies less than half of the period P.

In detecting such transmitted signals, a voltage comparator 46, shown in FIG. 2, has a reference voltage attached to the terminal 48 and which goes to the (+) input of the comparator. The (−) input 41 of the comparator goes by lead 45 to the junction 68 which is the termination B of a transmission line 38. The transmission line 38 is driven at A over lead 36 by a transistor driver 30, which is powered from an eight volt DC source 32, through a resistance 34 which is preferably equal to the characteristic impedance of the transmission line.

In FIG. 1 the reference voltage 24 is generally set at a value which is approximately half of the peak amplitude of the signal. In other words, if the line 10 represents the base of the signal voltage, then a negative peak to the value 14 will be approximatley eight volts negative, which is the magnitude of the driving voltage.

With the (+) input of the comparator at the value of the reference voltage, which may be minus four volts, then the comparator is sensitive to the voltage on lead 45 coming from the junction 68 whenever the voltage becomes more negative than the reference voltage 24.

In the case of the transmitted signal passing through a short line such as indicated by the slightly distorted and slightly attenuated signals "one" and "zero" in the center of FIG. 1, the times at which the line 12A drops below, or is more negative than, the reference voltage 24, is precisely that time at which the signal starts. The time at which the signal 16A again passes from a value more negative than to a value more positive than the reference voltage 24, again indicates the precise time of the termination of that pulse and similarly for the pulse representing a "zero", represented by the down line 18A and the up line 22A.

However, if the transmission means is longer, or attenuates the signal more strongly, the condition arises as in the right portion of FIG. 1 where the "one" pulse is represented by the falling line 12B, the peak value is 14B, and the rising line is 16B, and similarly for the "zero" pulse where the falling line is 18B and the rising line is 22B. It is seen that because of the signal distortion, particularly for the "zero" pulse, the amplitude of the signals is now less than the value of the reference voltage. Consequently such signals would not be detected by the circuit of FIG. 2.

The only way that the attenuated signals could be detected, particularly for the "zero" pulse, would be to use a less negative value of reference voltage, such as 26, which is approximately one-half the peak value of the signal. However, the reference voltage 26 would be only about 1.5 volts below the baseline 10, and therefore, any noise amplitude carried by this signal of greater magnitude than 1.5 volts would carry the potential of line 45 more negative than the reference voltage of 6.5 volts, and such noise pulses then would be detected as if they were signal pulses. If the noise amplitude was less than 1.5 volts, the reference signal of 6.5 volts would provide as good a detector as would be possible, considering the distortion of the signal. However, if the reference voltage had to be maintained at 1.5 volts below the base line, it would not be optimum for signals which were less attentuated, such as for a short transmission means.

It becomes important, therefore, to design a detector circuit in which the reference voltage, or slicing voltage, is a variable and is continuously adjusted to match the peak value of the attenuated signal. In this way the slicing voltage is substantially one-half of the peak value of the signal. That is the type of circuit illustrated in FIGS. 3 and 4.

Figure 4:
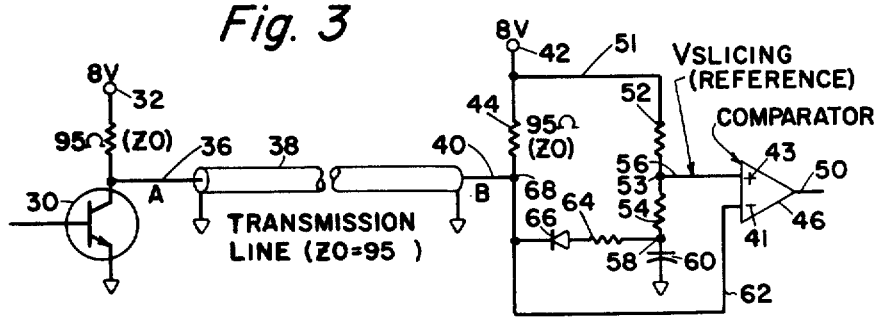
FIG. 4 illustrates one embodiment of the invention for providing a dynamic slicing voltage generator, for controlling the detection of signals of varying attenuation.

Referring now to FIG. 4, there is shown the transmission line 38 of FIG. 2, with a modified receiver at the output end B of the transmission line. The output line 40 is supported with voltage from terminal 42 of eight volts DC, through the resistor 44, again of the characteristic impedance of the transmission line. The (−) terminal 41 of the comparator 46 is connected through a line 62 to the terminal 68 of the transmission line.

There is a bypass circuit between the eight volt terminal 42 and the output terminal 68 of the transmission line, which comprises a line 51 connecting the terminal 42 to a first resistor 52, which is connected by junction 53 to a second resistor 54, to a junction 58, which is connected to a third resistor 64, which is connected through a diode 66 back to the output terminal 68 of the end B of the transmission line 38. A capacitor 60 is connected between the junction 58 and ground. The junction 53 is then connected by lead 56 to the (+) terminal 43 of the comparator 46. As in the case of FIG. 2, the output 50 of the comparator is the output line of the detected signal.

The time constant of the series connected capacitor 60, and the resistors 52 and 54, is sufficiently long and the time constant of resistor 64 and capacitor 60 sufficiently short, so that the voltage on junction 58 is substantially equal to the peak value of the signal. Thus the capacitor voltage follows closely the magnitude of the signal and, depending on the ratio of the resistors 52 and 54, the junction 53 is some voltage higher (less negative) than the voltage of the capacitor at 58. Thus, by choosing the two resistors 52 and 54, the reference voltage which appears at the junction 53 and goes to the (+) terminal 43 of the comparator 46 can be some fixed fraction of the voltage at 58, such as, for example, one-half.

In other words, the capacitor follows the negative peak value of the signal and the reference voltage maintains itself at a value one-half (or some other chosen ratio) of the peak value, so that no matter what the attenuation of th signal may be the slicing voltage of reference voltage will always be the chosen ratio of the peak value of the signal.

Figure 3:
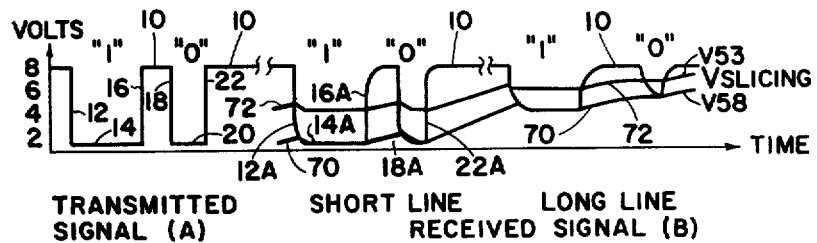
FIG. 3 illustrates the transmitted and received pulse width modulated signals, and the action of a dynamic slicing or reference voltage, for a pulse width modulated signal detector.

This is shown in FIG. 3 for the short transmission line and the long transmission line. The signal is only slightly attenuated with a short transmission line, and is more severely attenuated for the long transmission line. But for both the short line and the long line, the voltage of the capacitor at 58 follows the negative peak value of the signal, and the slicing voltage 72 is approximately one-helf of the negative voltage. In this way, whatever the attenuated value of the signal, the slicing voltage is adjusted correspondingly and a maximum value of slicing voltage is available to provide the greatest protection against noise interference, with the detecting circuit.

While the invention has been described with a certain degree of particularity, it is manifest that many changes may be made in the details of construction and the arrangement of components without departing from the spirit and scope of this disclosure. It is understood that the invention is not limited to the embodiments set forth herein for purposes of exemplification, but is to be limited only by the scope of the attached claim or claims, including the full range of equivalency to which each element thereof is entitled.

What is claimed is:

1. Dynamic slicing compenation means for detecting attenuated pulse width modulation signals, in noise, at the receiving end of a transmission means, comprising;
   (a) comparator means having a non-inverting first input and a an inverting second input, and an output; and means to connect the second input to said receiving end of said transmission means;
   (b) a voltage source of selected magnitude of voltage connected through a resistor of selected magnitude of resistance, to said receiving end of said transmission means;
   (c) a bypass circuit connected from said voltage source to said receiving end, comprising in series;
      1. a first resistor to a first junction point;
      2. a second resistor from said first junction point to a second junction point;
      3. a third resistor connected from said second junction point through a diode to said receiving end;
   (d) a capacitor of selected magnitude of capacitance connected from said second junction point to ground; and
   (e) said first junction connected to the first input of said comparator.

2. The compensation means as in claim 1 in which said first and second resistors have substantially equal resistance.

* * * * *